US012628510B2

(12) United States Patent
Yang et al.

(10) Patent No.: US 12,628,510 B2
(45) Date of Patent: May 12, 2026

(54) DISPLAY PANEL AND METHOD FOR MANUFACTURING SAME, AND DISPLAY DEVICE

(71) Applicants: Chengdu BOE Optoelectronics Technology Co., Ltd., Chengdu (CN); BOE Technology Group Co., Ltd., Beijing (CN)

(72) Inventors: Chengchung Yang, Beijing (CN); Weilin Lai, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 313 days.

(21) Appl. No.: 18/274,685

(22) PCT Filed: Oct. 22, 2021

(86) PCT No.: PCT/CN2021/125817
§ 371 (c)(1),
(2) Date: Jul. 27, 2023

(87) PCT Pub. No.: WO2022/199008
PCT Pub. Date: Sep. 29, 2022

(65) Prior Publication Data
US 2024/0090275 A1 Mar. 14, 2024

(30) Foreign Application Priority Data
Mar. 22, 2021 (CN) .......................... 202110301225.0

(51) Int. Cl.
*H10K 59/124* (2023.01)
*H10K 59/12* (2023.01)
(Continued)

(52) U.S. Cl.
CPC ....... *H10K 59/124* (2023.02); *H10K 59/1201* (2023.02); *H10K 59/122* (2023.02); *H10K 59/80516* (2023.02); *H10K 59/80521* (2023.02)

(58) Field of Classification Search
CPC ............. H10K 59/124; H10K 59/1201; H10K 59/122; H10K 59/80516; H10K 59/80521;
(Continued)

(56) References Cited

U.S. PATENT DOCUMENTS 9,685,634 B2 * 6/2017 Huangfu .............. H10K 71/164
2015/0060823 A1 * 3/2015 Furuie .................... H10K 59/88
257/40
(Continued)

FOREIGN PATENT DOCUMENTS

CN 109411619 A 3/2019
CN 110649078 A 1/2020
(Continued)

OTHER PUBLICATIONS

PCT/CN2021/125817 international search report.
CN202110301225.0 first office action dated Jun. 27, 2024.

*Primary Examiner* — Kevin Quarterman
(74) *Attorney, Agent, or Firm* — IPro, PLLC

(57) ABSTRACT

Provided is a display panel. The display panel includes: a light-emitting structure including a cathode layer and an anode layer, wherein the anode layer includes a first surface and a second surface that are opposite, the second surface facing towards the cathode layer; and the cathode layer includes a second cathode sub-layer including a third surface facing towards the same direction as the first surface, the third surface being lower than the first surface.

13 Claims, 3 Drawing Sheets

(51) Int. Cl.
  *H10K 59/122*          (2023.01)
  *H10K 59/80*           (2023.01)
(58) Field of Classification Search
  CPC ... H10K 59/121; H10K 59/353; H10K 50/822
  See application file for complete search history.

(56)                    References Cited

U.S. PATENT DOCUMENTS

| 2015/0179974 A1 | 6/2015 | Matsuura | |
| 2017/0125738 A1* | 5/2017 | Kim | H10K 59/877 |
| 2017/0133594 A1* | 5/2017 | Mimura | H10K 59/873 |
| 2017/0194599 A1* | 7/2017 | Furuie | H10K 59/8731 |
| 2018/0097047 A1* | 4/2018 | Jung | H10K 59/124 |
| 2019/0363276 A1 | 11/2019 | Li et al. | |
| 2020/0013984 A1 | 1/2020 | Kim | |
| 2020/0258958 A1 | 8/2020 | Gai et al. | |
| 2022/0190042 A1 | 6/2022 | Ye | |

FOREIGN PATENT DOCUMENTS

| CN | 111769149 A | 10/2020 |
| CN | 111785742 A | 10/2020 |
| CN | 111952341 A | 11/2020 |
| CN | 112086487 A | 12/2020 |
| CN | 212182332 U | 12/2020 |
| CN | 113066838 A | 7/2021 |
| JP | 2019012684 A | 1/2019 |

* cited by examiner

Moving direction of carries

DISPLAY PANEL AND METHOD FOR MANUFACTURING SAME, AND DISPLAY DEVICE

CROSS-REFERENCE TO RELATED APPLICATIONS

This application is a U.S. national stage of international application No. PCT/CN2021/125817, filed on Oct. 22, 2021, which claims priority to Chinese Patent Application No. 202110301225.0 filed on Mar. 22, 2021, the disclosures of which are herein incorporated by references in their entireties.

TECHNICAL FIELD

The present disclosure relates to the field of display technologies, and in particular, relates to a display panel and a method for manufacturing the same, and a display device.

BACKGROUND OF THE INVENTION

With the improvement of the display resolution, the density of pixels in a display screen becomes higher and higher.

SUMMARY OF THE INVENTION

Embodiments of the present disclosure provide a display panel and a method for manufacturing the same, and a display device.

A display panel according to the embodiments of the present disclosure includes: a light-emitting structure including a cathode layer and an anode layer, wherein the anode layer includes a first surface and a second surface that are opposite, the second surface facing towards the cathode layer; and the cathode layer includes a second cathode sub-layer including a third surface facing towards the same direction as the first surface, the third surface being lower than the first surface.

In some embodiments, the light-emitting structure further includes a planarization layer and a source and drain layer, wherein the planarization layer is disposed on a side, distal from the cathode layer, of the anode layer, and the anode layer is electrically connected to the source and drain layer upon running through the planarization layer.

In some embodiments, the anode layer includes a plurality of anodes, wherein a first recess is defined in the planarization layer between adjacent anodes, and the second cathode sub-layer is disposed in the first recess.

In some embodiments, the light-emitting structure further includes an organic light-emitting layer between the cathode layer and the anode layer, wherein the organic light-emitting layer is configured to emit light under driving of the anode layer and the cathode layer.

In some embodiments, the light-emitting structure further includes an adsorption electrode disposed in the first recess and connected to the organic light-emitting layer.

In some embodiments, the adsorption electrode is disposed between the organic light-emitting layer and the source and drain layer, and is connected to the source and drain layer.

In some embodiments, the cathode layer further includes a first cathode sub-layer opposite to the anode layer.

In some embodiments, the light-emitting structure further includes a pixel defining layer disposed between the anode layer and the cathode layer and configured to define a light-emitting region, wherein a second recess is defined in the pixel defining layer between adjacent anodes, and the second cathode sub-layer runs through the second recess.

In some embodiments, the display panel further includes: a backplane and a package layer that are opposite, wherein the light-emitting structure is disposed between the backplane and the package layer.

A method for manufacturing a display panel according to the embodiments of the present disclosure includes:
providing a backplane, and forming a source and drain layer on the backplane;
forming a planarization layer on the source and drain layer, wherein a first recess is defined in the planarization layer;
forming an anode layer and an adsorption electrode on the planarization layer, wherein the anode layer includes a first surface and a second surface that are opposite, and the adsorption electrode is opposite to the first recess and connected to the source and drain layer;
forming a pixel defining layer on the anode layer, and forming a second recess in the pixel defining layer, wherein the second recess corresponds to the first recess;
forming an organic light-emitting layer on the pixel defining layer, wherein at least a part of the organic light-emitting layer is disposed in the first recess to be connected to the adsorption electrode; and
forming a cathode layer on the organic light-emitting layer, wherein the cathode layer includes a second cathode sub-layer including a third surface facing towards the same direction as the first surface, the third surface being lower than the first surface.

A display device according to the embodiments of the present disclosure includes the display panel in any one of the above embodiments.

Additional aspects and technical effects of the embodiments of the present disclosure are shown in the following descriptions, some of which are obvious from the following descriptions, or understood by embodiments of the present disclosure.

BRIEF DESCRIPTION OF DRAWINGS

Above and/or additional aspects and technical effects of the present disclosure are obvious and easily understood based on the descriptions of the embodiments in conjunction with the accompanying drawings.

Figure 1:
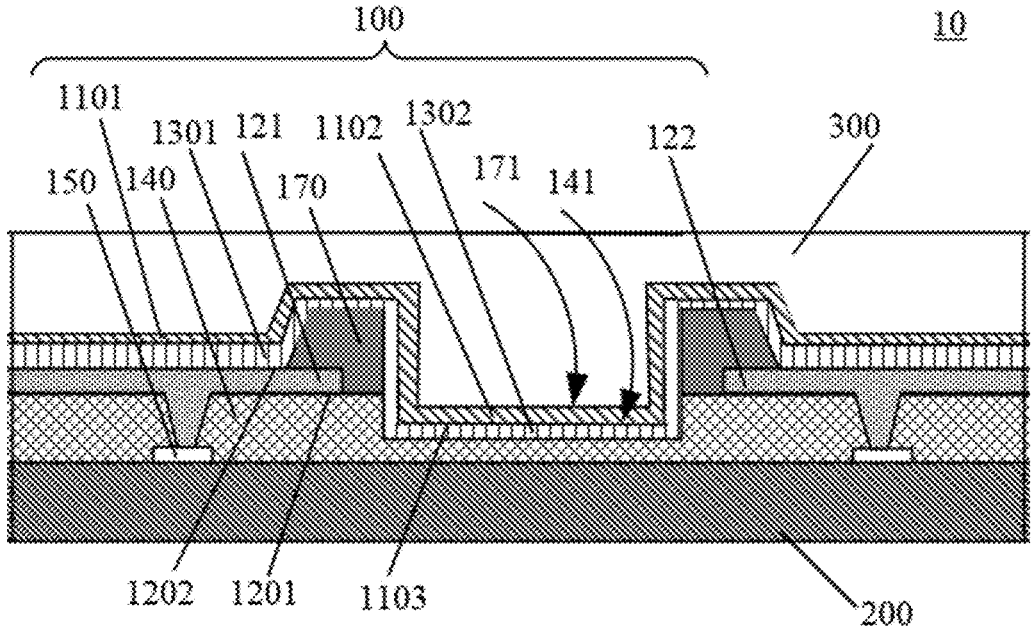
FIG. 1 is a schematic structural diagram of a display panel according to some embodiments of the present disclosure.

Reference numerals and denotations thereof:
10—display panel, 100—light-emitting structure, 110—cathode layer, 1101—first cathode sub-layer, 1102—second cathode sub-layer, 1103—third surface, 120—anode layer, 121—first anode, 122—second anode, 1201—first surface, 1202—second surface, 130—organic light-emitting layer, 1301—first organic light-emitting sub-layer, 1302—second organic light-emitting sub-layer, 140—planarization layer, 141—first recess, 150—source and drain layer, 160—adsorption electrode, 170—pixel defining layer, 171—second recess, 200—backplane, and 300—package layer.

DETAILED DESCRIPTION OF THE INVENTION

The embodiments of the present disclosure are described hereinafter in detail, examples of which are illustrated in the accompanying drawings. Throughout the accompanying drawings, the same or similar reference numerals represent the same or similar components or components with the same or similar functions. The embodiments described below with reference to the accompanying drawings are exemplary, and are only intended to explain the present disclosure, rather than to limit the present disclosure.

In the description of the present disclosure, the terms "first" and "second" are only used for the purpose of description and should not be construed as indicating or implying relative importance or implicitly indicating the number of technical features as indicated. Thus, features defined by the terms "first" and "second" may explicitly or implicitly include one or more of the features. Unless otherwise clearly defined, the expression "a plurality of" refers to two or more.

The description hereinafter provides a plurality of different embodiments or examples to implement different structures of the present disclosure. For simplification of the present disclosure, the components and settings in specific examples are described hereinafter. They are only examples and are not intended to limit the present disclosure. In addition, reference numerals and/or reference letters are repeated in different examples in the present disclosure for simplification and clarity, and the repetition itself does not indicate the relationship between the discussed various embodiments and/or settings. In addition, examples of various specific processes and materials are provided in the present disclosure, but persons skilled in the art may understand the application of other processes and/or the use of other materials.

Referring to FIG. 1, the display panel 10 includes a light-emitting structure 100. The light-emitting structure 100 includes a cathode layer 110 and an anode layer 120. The anode layer 120 includes a first surface 1201 and a second surface 1202 that are opposite, and the second surface 1202 faces towards the cathode layer 110. The cathode layer 110 includes a second cathode sub-layer 1102, the second cathode sub-layer 1102 includes a third surface 1103 facing towards the same direction as the first surface 1201, and the third surface 1103 is lower than the first surface 1202.

The display panel includes blue pixels, green pixels, and red pixels. The three types of pixels are densely arranged in the display panel in an order of the blue pixel, the green pixel, and the red pixel. As a driving voltage of the blue pixel is greater than a driving voltage of the green pixel and a driving voltage of the red pixel, the driving voltage of the green pixel is greater than the driving voltage of the red pixel, an anode of the blue pixel is close to an anode of the green pixel, and the anode of the green pixel is close to an anode of the red pixel, in the case that the blue pixel emits light and the adjacent green pixel does not emit light, the green pixel is prone to coupling luminance due to a parasitic capacitance between the blue pixel and the green pixel, and thus the blue and green crosstalk is formed. Similarly, in the case that the green pixel emits light and the adjacent red pixel does not emit light, the red pixel is prone to coupling luminance due to a parasitic capacitance between the green pixel and the red pixel, and thus the red and green crosstalk is formed. The signal crosstalk may affect the display effect.

In addition, as the anode of the blue pixel is close to the anode of the green pixel, the current leakage of transverse carriers of the organic light-emitting layer 130 is caused. That is, in the case that the blue pixel emits light, and the adjacent green pixel and the red pixel do not emit light, the adjacent green pixel emits light due to transversely moved carriers, and the adjacent red pixel may also emit light. Similarly, in the case that the green pixel emits light, and the adjacent red pixel does not emit light, the adjacent red pixel emits light due to transversely moved carriers. Thus, the display effect is poor, and the user experience is poor.

In the display panel 10 in the embodiments of the present disclosure, the light-emitting structure 100 is configured to achieve functions, such as luminance driving and control, and the like, and the light-emitting structure 100 includes a cathode layer 110 and an anode layer 120.

The anode layer 120 includes a first surface 1201 and a second surface 1202 that are opposite, and the second surface 1202 faces towards the cathode layer 110. Specifically, the second surface 1202 faces towards a first cathode sub-layer 1101. In the orientation shown in FIG. 1, the first surface 1201 is a lower face of the anode layer 120, and the second surface 1202 is an upper face of the anode layer 120.

The cathode layer 110 includes a first cathode sub-layer 1101 and a second cathode sub-layer 1102. The second cathode sub-layer 1102 includes a third surface 1103 facing towards the same direction as the first surface 1201. The third surface 1103 is lower than the first surface 1202. In the orientation shown in FIG. 1, the third surface 1103 is a lower face of the cathode layer 110.

The third surface 1103 disposed with the second cathode sub-layer 1102 is lower than the first surface 1202, such that the parasitic capacitance formed between adjacent anodes is isolated, the crosstalk between the adjacent pixels is efficiently improved, and the display effect is improved.

It should be noted that the anode layer 120 includes a plurality of anodes, for example, a first anode 121, a second anode 122, and the like, and the cathode layer 110 includes the first cathode sub-layer 1101 corresponding to the anodes and a second cathode sub-layer 1102 between the adjacent anodes. As the light-emitting structure 100 includes a plurality of anodes, the light-emitting structure 100 further includes a plurality of first cathode sub-layers 1101 and a plurality of second cathode sub-layers 1102. The first cathode sub-layer 1101 corresponds to the anode layer 120, and the second cathode sub-layer 1102 is disposed in a first recess 141 formed in a planarization layer 140.

In some embodiments, the light-emitting structure 100 further includes a planarization layer 140 and a source and drain layer 150. The planarization layer 140 is disposed on a side, distal from the cathode layer 110, of the anode layer 120, and the anode layer 120 is electrically connected to the source and drain layer 150 upon running through the planarization layer 140.

The planarization layer 140 is configured to ensure a reliability and a stability of manufacturing process of the display panel 10, the source and drain layer 150 is electrically connected to the anodes, such that a control signal is transmitted to the anode to control the pixel to emit light.

In some embodiments, the anode layer 120 includes a plurality of anodes. A first recess 141 is defined in the planarization layer 140 between adjacent anodes, and the second cathode sub-layer 1102 is disposed in the first recess 141.

Specifically, the first recess 141 is defined in the planarization layer 140 between adjacent anodes, and the second cathode sub-layer 1102 is disposed in the first recess 141.

In some embodiments, in the case that the green pixel emits light, and the adjacent red pixel does not emit light, as the first recess 141 is defined between the anode of the green pixel and the anode of the red pixel, the second cathode sub-layer 1102 in the first recess 141 isolates the parasitic capacitance between the anode of the green pixel and the anode of the red pixel.

As such, the crosstalk between the adjacent pixels is efficiently improved.

In some embodiments, the light-emitting structure 100 further includes an organic light-emitting layer 130 between the cathode layer 110 and the anode layer 120. The organic light-emitting layer 130 is configured to emit light under driving of the anode layer 120 and the cathode layer 110.

Specifically, the organic light-emitting layer 130 includes a first organic light-emitting sub-layer 1301 corresponding to the anodes and a second organic light-emitting sub-layer 1302 between the adjacent anodes. The second organic light-emitting sub-layer 1302 is disposed in the first recess 141. As the light-emitting structure 100 includes the plurality of anodes, the light-emitting structure 100 further includes a plurality of first organic light-emitting sub-layers 1301 and a plurality of second organic light-emitting sub-layers 1302.

In some embodiments, in the case that the green pixel emits light, and the adjacent red pixel does not emit light, as the first recess 141 is defined between the anode of the green pixel and the anode of the red pixel, the second organic light-emitting sub-layer 1302 and the second cathode sub-layer 1102 in the first recess 141 isolate the parasitic capacitance between the anode of the green pixel and the anode of the red pixel.

As such, the crosstalk between the adjacent pixels is efficiently improved.

Compared with the light-emitting structure not disposed with the first recess 141, the organic light-emitting layer 130 of the light-emitting structure disposed with the first recess 141 includes the second organic light-emitting sub-layer 1302 in the first recess 141, the organic light-emitting layer 130 is longer, the prolonged organic light-emitting layer 130 efficiently improves the crosstalk between the adjacent pixels, and thus the display effect is improved.

Figure 2:
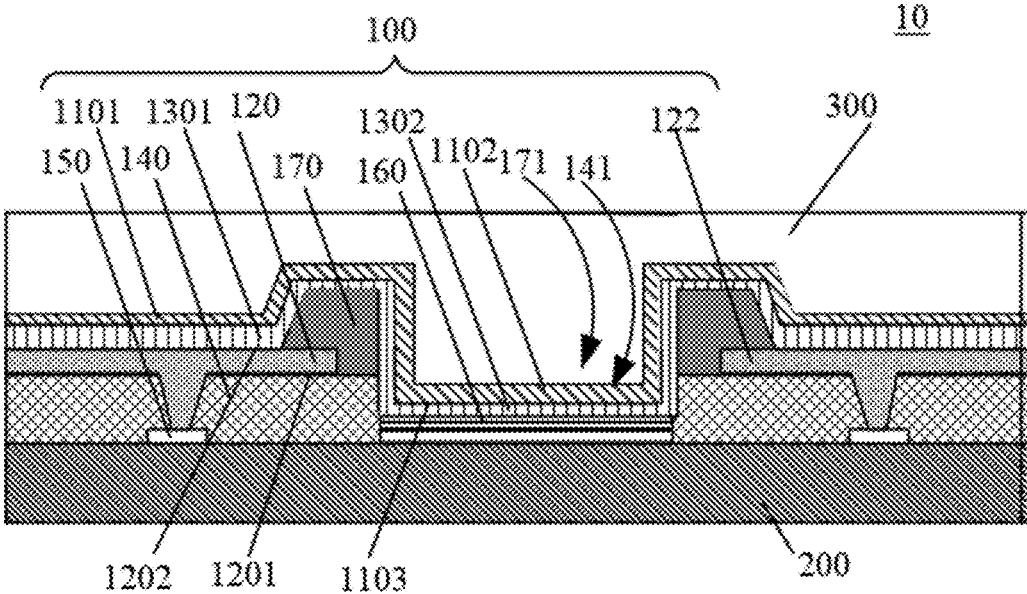
FIG. 2 is a schematic structural diagram of another display panel according to some embodiments of the present disclosure.

Referring to FIG. 2, in some embodiments, the light-emitting structure 100 further includes an adsorption electrode 160 disposed in the first recess 141 and connected to the organic light-emitting layer 130.

Specifically, the adsorption electrode 160 is disposed in the first recess 141 and between the adjacent anodes, is electrically connected to the second organic light-emitting sub-layer 1302, and is configured to attach transverse carriers between the adjacent anodes in the organic light-emitting layer 130.

Figure 3:
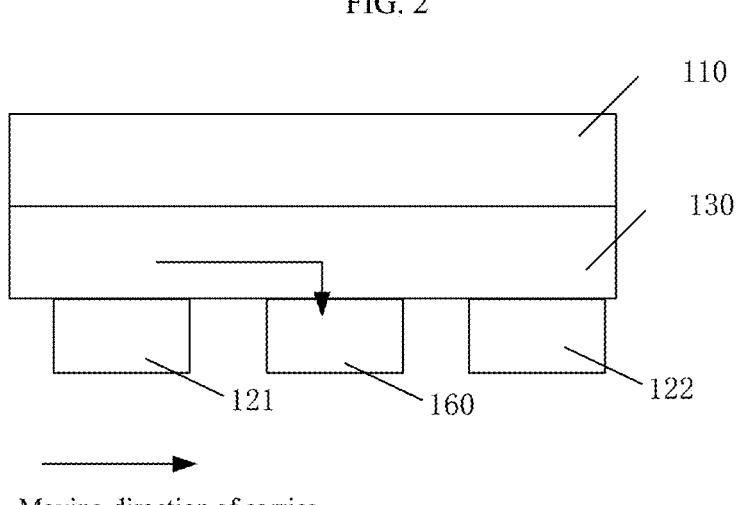
FIG. 3 is a schematic diagram of a display panel according to some embodiments of the present disclosure.

Referring to FIG. 3, in some embodiments, in the case that the green pixel emits light, and the adjacent red pixel does not emit light, as the adsorption electrode 160 is present between the anode 121 of the green pixel and the anode 122 of the red pixel, the adsorption electrode 160 attaches the transverse carriers in the case that a negative voltage (for example, −10 V, −15 V, and the like) is supplied to the adsorption electrode 160. As such, the current leakage of the transverse carriers is reduced, the crosstalk between the adjacent pixels is improved, and the display effect is improved.

In addition, as the first recess 141 and a second recess 171 are present between the anode of the green pixel and the anode of the red pixel, the second organic light-emitting sub-layer 1302 and the second cathode sub-layer 1102 in the first recess 141 and the second recess 171 isolate the parasitic capacitance between the anode of the green pixel and the anode of the red pixel, such that the crosstalk between the adjacent pixels is further improved.

In some embodiments, the adsorption electrode 160 is disposed between the organic light-emitting layer 130 and the source and drain layer 150 and is connected to the source and drain layer 150.

Specifically, the adsorption electrode 160 is disposed between the organic light-emitting layer 130 and the source and drain layer 150, and is electrically connected to the organic light-emitting layer 130 and the source and drain layer 150. The adsorption electrode 160 is configured to attach the transverse carriers between the adjacent anodes, and the detailed embodiments are similar to the above embodiments, which are not repeated herein.

In some embodiments, the light-emitting structure 100 further includes a pixel defining layer 170. The pixel defining layer 170 is disposed between the anode layer 120 and the cathode layer 110, and is configured to define a light-emitting region. A second recess 171 is defined in the pixel defining layer 170 between adjacent anodes, and the second cathode sub-layer 1102 runs through the second recess 171.

Specifically, the pixel defining layer 170 is disposed between the anode layer 120 and the cathode layer 110, and is configured to define the light-emitting region, for example, an area for emitting light, and the like. The second recess 171 is defined in the pixel defining layer 170 between the adjacent anodes, the second organic light-emitting sub-layer 1302 and the second cathode sub-layer 1102 are disposed in the second recess 171, and the second cathode sub-layer 1102 runs through the second recess 171.

In some embodiments, in the case that the green pixel emits light, and the adjacent red pixel does not emit light, as the second recess 171 is defined between the anode of the green pixel and the anode of the red pixel, the second organic light-emitting sub-layer 1302 and the second cathode sub-layer 1102 in the second recess 171 isolate the parasitic capacitance between the anode of the green pixel and the anode of the red pixel. As such, the crosstalk between the adjacent pixels is efficiently improved.

Compared with the light-emitting structure not disposed with the second recess 171, the light-emitting structure 100 is disposed with the second recess 171, the organic light-emitting layer 130 includes the second organic light-emitting sub-layer 1302 in the second recess 171, the organic light-emitting layer 130 is longer, the prolonged organic light-emitting layer 130 efficiently improves the crosstalk between the adjacent pixels, and thus the display effect is improved.

In some embodiments, the display panel 10 further includes a backplane 200 and a package layer 300 that are opposite. The light-emitting structure 100 is disposed between the backplane 200 and the package layer 300.

Specifically, the package layer 300 is disposed on a side, distal from the anode layer 120, of the cathode layer 110, is densely attached to the cathode layer 110, and is configured to package the light-emitting structure 100 and reduce or prevent the degradation of the light-emitting structure 100 caused by moisture and/or oxygen in the environment. The package layer 300 is a single-layer structure or a composited-layer structure, which is not limited.

The backplane 200 is disposed on a side, distal from the anode layer 120, of the source and drain layer 150, is densely attached to the source and drain layer 150 and/or the planarization layer 140, and is configured to provide a display driving signal to the light-emitting structure 100 and protect the light-emitting structure 100, such that the degradation of the light-emitting structure 100 is reduced or prevented.

Figure 4:
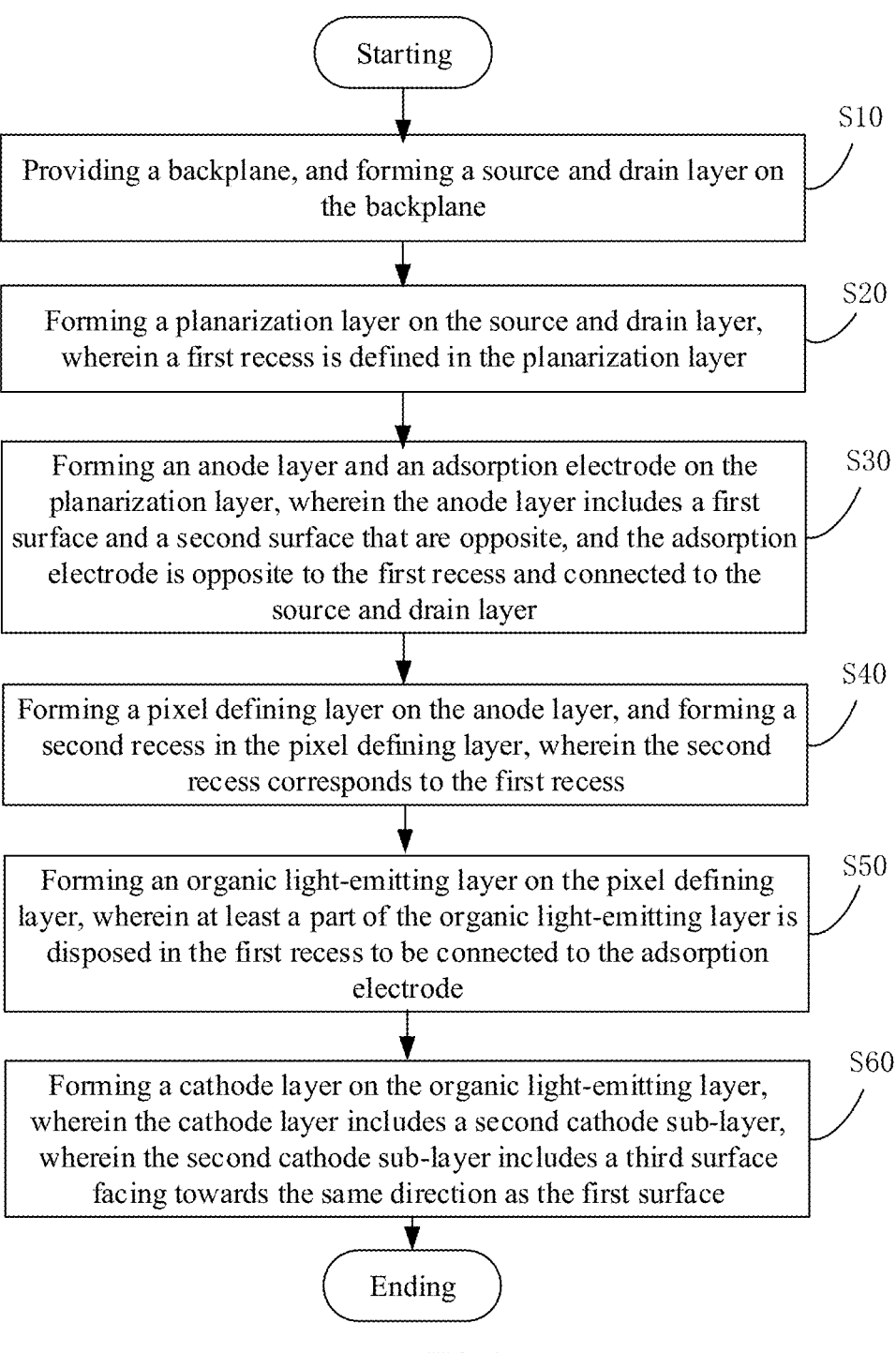
FIG. 4 is a flow chart of a method for manufacturing a display panel according to some embodiments of the present disclosure.

Referring to FIG. 1 and FIG. 4, the method for manufacturing the display panel 10 in the embodiments of the present disclosure includes the following processes.

In S10, a backplane 200 is provided, and a source and drain layer 150 is formed on the backplane 200.

In S20, a planarization layer 140 is formed on the source and drain layer 150, wherein a first recess 141 is defined in the planarization layer 140.

In S30, an anode layer 120 and an adsorption electrode 160 are formed on the planarization layer 140, wherein the anode layer 120 includes a first surface 1201 and a second surface 1202 that are opposite, and the adsorption electrode 160 is opposite to the first recess 141 and connected to the source and drain layer 150.

In S40, a pixel defining layer 170 is formed on the anode layer 120, and a second recess 171 is defined in the pixel defining layer, wherein the second recess 171 corresponds to the first recess 141.

In S50, an organic light-emitting layer 130 is formed on the pixel defining layer 170, wherein at least a part of the organic light-emitting layer 130 is disposed in the first recess 141 to be connected to the adsorption electrode 160.

In S60, a cathode layer 110 is formed on the organic light-emitting layer 130, wherein the cathode layer 110 includes a second cathode sub-layer 1102 including a third surface 1103 facing towards the same direction as the first surface 1201.

Specifically, referring to FIG. 1, the anode layer 120 includes a plurality of anodes, for example, a first anode, a second anode, and the like, the organic light-emitting layer 130 includes a first organic light-emitting sub-layer 1301 corresponding to the anodes and a second organic light-emitting sub-layer 1302 between the adjacent anodes, and the cathode layer 110 includes the first cathode sub-layer 1101 corresponding to the anodes and a second cathode sub-layer 1102 between the adjacent anodes. As the light-emitting structure 100 includes a plurality of anodes, the light-emitting structure 100 includes a plurality of first organic light-emitting sub-layers 1301 and a plurality of second organic light-emitting sub-layers 1302, and further includes a plurality of first cathode sub-layers 1101 and a plurality of second cathode sub-layers 1102. The plurality of first organic light-emitting sub-layers 1301 and the plurality of first cathode sub-layers 1101 are disposed beyond the first recess 141 and the second recess 171, and correspond to the anodes. The plurality of second organic light-emitting sub-layers 1302 and the plurality of second cathode sub-layers 1102 are disposed in the first recess 141 and the second recess 171. The first cathode sub-layer 1101 corresponds to the anode layer 120, and the second cathode sub-layer 1102 is disposed in the first recess 141 formed in the planarization layer 140.

In the method for manufacturing the display panel 10 in the embodiments of the present disclosure, the third surface 1103 of the second cathode sub-layer 1102 is lower than the first surface 1201 of the anode layer, and the cathode layer 110 is partially disposed between anodes of the adjacent pixels. That is, the second cathode sub-layer 1102 isolates the parasitic capacitance between the adjacent anodes, such that the crosstalk between the adjacent pixels is efficiently improved, and the display effect is improved. In addition, the prolonged organic light-emitting layer 130 efficiently improves the crosstalk between the adjacent pixels.

Furthermore, referring to FIG. 2, the adsorption electrode 160 is disposed between adjacent anodes and between the organic light-emitting layer 130 and the source and drain layer 150, and is opposite to the first recess 141. The adsorption electrode 160 is electrically connected to the second organic light-emitting sub-layer 1302 in the first recess 141, and is configured to attach transverse carriers between the adjacent anodes.

As such, the adsorption electrode 160 attaches the transverse carriers in the case that a negative voltage (for example, −10 V, −15 V, and the like) is supplied to the adsorption electrode 160, such that the current leakage of the transverse carriers is reduced, the crosstalk between the adjacent pixels is improved, and the display effect is improved.

In addition, as the first recess 141 and a second recess 171 are present between the anodes of the adjacent pixels, and the second organic light-emitting sub-layer 1302 and the second cathode sub-layer 1102 in the first recess 141 and the second recess 171 isolate the parasitic capacitance between the anodes of the adjacent pixels, such that the crosstalk between the adjacent pixels is further improved.

The display device in the embodiments of the present disclosure includes the display panel 10 in any one of the above embodiments.

Specifically, the display device is a device, such as a mobile phone, a tablet personal computer, a cash machine, a smart wearable device, a smart home appliance, a game console, a headset, and the like, which is not limited. It can be understood that the display device can also be any other device with a display function.

In the descriptions of the present specification, the descriptions about reference terms such as "one embodiment," "some embodiments," "exemplary embodiments," "examples," "some specific examples," "some examples," and the like mean that the specific features, structures, materials or characteristics described in combination with the embodiments are included in at least one embodiment or example of the present disclosure. In the present specification, the schematic descriptions of the above terms do not necessarily refer to a same embodiment or example. Furthermore, the specific features, structures, materials or characteristics as described can be integrated with any one or more embodiments or examples in a proper manner.

Although the embodiments of the present disclosure have been shown and described above, it can be understood by those skilled in the art that the embodiments can be changed, modified, substituted, and varied without departing from the principles and purposes of the present disclosure, and the scope of the present disclosure is defined by the claims and their equivalents.

What is claimed is:

1. A display panel, comprising: a light-emitting structure comprising a cathode layer, an anode layer, a planarization layer and a source and drain layer, wherein the anode layer comprises a first surface and a second surface that are opposite to each other, the second surface facing towards the cathode layer, and the first surface facing towards the planarization layer;

the cathode layer comprises a first cathode sub-layer opposite to the anode layer and a second cathode sub-layer comprising a third surface facing towards the same direction as the first surface, the third surface being lower than the first surface;

the anode layer is electrically connected to the source and drain layer upon running through the planarization layer; and the anode layer comprises a plurality of anodes, wherein a first recess is defined in the planarization layer between adjacent anodes, and the second cathode sub-layer is disposed in the first recess, wherein the second cathode sub-layer in the first recess isolates parasitic capacitance between adjacent anodes.

2. The display panel according to claim 1, wherein the light-emitting structure further comprises an organic light-emitting layer between the cathode layer and the anode layer, wherein the organic light-emitting layer is configured to emit light under driving of the anode layer and the cathode layer.

3. The display panel according to claim 2, wherein the light-emitting structure further comprises an adsorption electrode disposed in the first recess and connected to the organic light-emitting layer.

4. The display panel according to claim 3, wherein the adsorption electrode is disposed between the organic light-emitting layer and the source and drain layer, and is connected to the source and drain layer.

5. The display panel according to claim 1, wherein the light-emitting structure further comprises a pixel defining layer disposed between the anode layer and the cathode layer and configured to define a light-emitting region, wherein a second recess is defined in the pixel defining layer between adjacent anodes, and the second cathode sub-layer runs through the second recess.

6. The display panel according to claim 1, further comprising: a backplane and a package layer that are opposite to each other, wherein the light-emitting structure is disposed between the backplane and the package layer.

7. A method for manufacturing a display panel, comprising:

providing a backplane, and forming a source and drain layer on the backplane;

forming a planarization layer on the source and drain layer, wherein a first recess is defined in the planarization layer;

forming an anode layer and an adsorption electrode on the planarization layer, wherein the anode layer comprises a first surface and a second surface that are opposite to each other, wherein the first surface faces towards the planarization layer and the adsorption electrode is opposite to the first recess and connected to the source and drain layer;

forming a pixel defining layer on the anode layer, and forming a second recess in the pixel defining layer, wherein the second recess corresponds to the first recess;

forming an organic light-emitting layer on the pixel defining layer, wherein at least a part of the organic light-emitting layer is disposed in the first recess to be connected to the adsorption electrode; and forming a cathode layer on the organic light-emitting layer, wherein the cathode layer comprises a first cathode sub-layer opposite to the anode layer and a second cathode sub-layer comprising a third surface facing towards the same direction as the first surface, the third surface being lower than the first surface;

wherein the anode layer is electrically connected to the source and drain layer upon running through the planarization layer; and the anode layer comprises a plurality of anodes, wherein a first recess is defined in the planarization layer between adjacent anodes, and the second cathode sub-layer is disposed in the first recess, wherein the second cathode sub-layer in the first recess isolates parasitic capacitance between adjacent anodes.

8. A display device, comprising: a display panel, wherein the display panel comprises: a light-emitting structure comprising a cathode layer, an anode layer, a planarization layer and a source and drain layer, wherein the anode layer comprises a first surface and a second surface that are opposite to each other, the second surface facing towards the cathode layer, and the first surface facing towards the planarization layer;

the cathode layer comprises a first cathode sub-layer opposite to the anode layer and a second cathode sub-layer comprising a third surface facing towards the same direction as the first surface, the third surface being lower than the first surface;

the anode layer is electrically connected to the source and drain layer upon running through the planarization layer; and the anode layer comprises a plurality of anodes, wherein a first recess is defined in the planarization layer between adjacent anodes, and the second cathode sub-layer is disposed in the first recess, wherein the second cathode sub-layer in the first recess isolates parasitic capacitance between adjacent anodes.

9. The display device according to claim 8, wherein the light-emitting structure further comprises an organic light-emitting layer between the cathode layer and the anode layer, wherein the organic light-emitting layer is configured to emit light under driving of the anode layer and the cathode layer.

10. The display device according to claim 9, wherein the light-emitting structure further comprises an adsorption electrode disposed in the first recess and connected to the organic light-emitting layer.

11. The display device according to claim 10, wherein the adsorption electrode is disposed between the organic light-emitting layer and the source and drain layer, and is connected to the source and drain layer.

12. The display device according to claim 8, wherein the light-emitting structure further comprises a pixel defining layer disposed between the anode layer and the cathode layer and configured to define a light-emitting region, wherein a second recess is defined in the pixel defining layer between adjacent anodes, and the second cathode sub-layer runs through the second recess.

13. The display device according to claim 8, wherein the display panel further comprises: a backplane and a package layer that are opposite to each other, wherein the light-emitting structure is disposed between the backplane and the package layer.

*    *    *    *    *